United States Patent
Pierce

(10) Patent No.: US 6,933,617 B2
(45) Date of Patent: Aug. 23, 2005

(54) WAFER INTERPOSER ASSEMBLY

(75) Inventor: John L. Pierce, Dallas, TX (US)

(73) Assignee: Eaglestone Partners I, LLC, Long Beach, CA (US)

(*) Notice: Subject to any disclaimer, the term of this patent is extended or adjusted under 35 U.S.C. 154(b) by 199 days.

(21) Appl. No.: 10/373,413

(22) Filed: Feb. 24, 2003

(65) Prior Publication Data

US 2003/0148108 A1 Aug. 7, 2003

Related U.S. Application Data

(62) Division of application No. 09/738,228, filed on Dec. 15, 2000, now Pat. No. 6,524,885.

(51) Int. Cl.⁷ .............................. H01L 23/48
(52) U.S. Cl. ................. 257/786; 257/673; 257/701; 257/734; 257/778
(58) Field of Search ................. 257/673, 701, 257/712–714, 721, 734, 778, 786

(56) References Cited

U.S. PATENT DOCUMENTS

| | | |
|---|---|---|
| 3,939,588 A | 2/1976 | Hockaday |
| 4,577,214 A | 3/1986 | Schaper |
| 4,617,730 A | 10/1986 | Geldermans et al. |
| 4,628,411 A | 12/1986 | Balderes et al. |
| 4,688,151 A | 8/1987 | Kraus et al. |
| 4,868,712 A | 9/1989 | Woodman |
| 4,998,885 A | 3/1991 | Beaman |
| 5,016,138 A | 5/1991 | Woodman |
| 5,060,052 A | 10/1991 | Casto et al. |
| 5,065,227 A | 11/1991 | Frankeny et al. |
| 5,086,558 A | 2/1992 | Grube et al. |
| 5,123,850 A | 6/1992 | Elder et al. |
| 5,132,613 A | 7/1992 | Papae et al. |
| 5,148,265 A | 9/1992 | Khandros et al. |
| 5,148,266 A | 9/1992 | Khandros et al. |
| 5,309,021 A | 5/1994 | Shimamoto et al. |
| 5,327,325 A | 7/1994 | Nicewarner, Jr. |
| 5,347,159 A | 9/1994 | Khandros et al. |
| 5,347,162 A | 9/1994 | Pasch |
| 5,371,654 A | 12/1994 | Beaman et al. |
| 5,382,898 A | 1/1995 | Subramanian |
| 5,384,691 A | 1/1995 | Neugebauer et al. |
| 5,394,303 A | 2/1995 | Yamaji |
| 5,399,505 A | 3/1995 | Dasse et al. |
| 5,399,898 A | 3/1995 | Rostoker |
| 5,410,259 A | 4/1995 | Fujihara et al. |
| 5,476,211 A | 12/1995 | Khandros |
| 5,477,160 A | 12/1995 | Love |
| 5,483,421 A | 1/1996 | Gedney et al. |
| 5,489,804 A | 2/1996 | Pasch |
| 5,491,612 A | 2/1996 | Nicewarner, Jr. |
| 5,497,079 A | 3/1996 | Yamada et al. |
| 5,504,369 A | 4/1996 | Dasse et al. |
| 5,517,515 A | 5/1996 | Spall et al. |
| 5,518,964 A | 5/1996 | DiStefano et al. |

(Continued)

*Primary Examiner*—Andy Huynh
(74) *Attorney, Agent, or Firm*—Lawrence R. Youst; Danamraj & Youst, P.C.

(57) ABSTRACT

A wafer interposer assembly and a system for building the same are disclosed. The wafer interposer assembly includes a semiconductor wafer (10) having a die (11) and a redistribution layer pad (13) electrically connected to the die (11). An epoxy layer (20) is deposited on the surface of the redistribution layer pad (13) and the die (11). An interposer pad (50) is positioned in an opening (40) in the epoxy layer (20) in electrical contact with the redistribution layer pad (13).

29 Claims, 3 Drawing Sheets

U.S. PATENT DOCUMENTS

| | | |
|---|---|---|
| 5,531,022 A | 7/1996 | Beaman et al. |
| 5,532,610 A | 7/1996 | Tsujide et al. |
| 5,532,612 A | 7/1996 | Liang |
| 5,544,017 A | 8/1996 | Beilin et al. |
| 5,570,032 A | 10/1996 | Atkins et al. |
| 5,579,207 A | 11/1996 | Hayden et al. |
| 5,594,273 A | 1/1997 | Dasse et al. |
| 5,600,257 A | 2/1997 | Leas et al. |
| 5,600,541 A | 2/1997 | Bone et al. |
| 5,612,575 A | 3/1997 | De Givry |
| 5,615,089 A | 3/1997 | Yoneda et al. |
| 5,635,010 A | 6/1997 | Pepe et al. |
| 5,637,920 A | 6/1997 | Loo |
| 5,654,588 A | 8/1997 | Dasse et al. |
| 5,655,290 A | 8/1997 | Moresco et al. |
| 5,685,885 A | 11/1997 | Khandros et al. |
| 5,701,666 A | 12/1997 | DeHaven et al. |
| 5,710,071 A | 1/1998 | Beddingfield et al. |
| 5,714,800 A | 2/1998 | Thompson |
| 5,759,047 A | 6/1998 | Brodsky et al. |
| 5,764,071 A | 6/1998 | Chan et al. |
| 5,764,655 A | 6/1998 | Kirihata et al. |
| 5,789,807 A | 8/1998 | Correale, Jr. |
| 5,794,175 A | 8/1998 | Conner |
| 5,796,746 A | 8/1998 | Farnworth et al. |
| 5,798,652 A | 8/1998 | Taraci |
| 5,800,184 A | 9/1998 | Lopergolo et al. |
| 5,802,713 A | 9/1998 | Deamer |
| 5,805,422 A | 9/1998 | Otake et al. |
| 5,806,181 A | 9/1998 | Khandros et al. |
| 5,832,601 A | 11/1998 | Eldridge et al. |
| 5,834,844 A | 11/1998 | Akagawa et al. |
| 5,834,946 A | 11/1998 | Albrow et al. |
| 5,838,060 A | 11/1998 | Comer |
| 5,838,072 A | 11/1998 | Li et al. |
| 5,844,803 A | 12/1998 | Beffa |
| 5,848,467 A | 12/1998 | Khandros et al. |
| 5,854,507 A | 12/1998 | Miremadi et al. |
| 5,878,486 A | 3/1999 | Eldridge et al. |
| 5,885,849 A | 3/1999 | DiStefano et al. |
| 5,892,287 A | 4/1999 | Hoffman et al. |
| 5,897,326 A | 4/1999 | Eldridge et al. |
| 5,900,738 A | 5/1999 | Khandros et al. |
| 5,905,382 A | 5/1999 | Wood et al. |
| 5,915,752 A | 6/1999 | DiStefano et al. |
| 5,927,193 A | 7/1999 | Balz et al. |
| 5,929,651 A | 7/1999 | Leas et al. |
| 5,936,847 A | 8/1999 | Kazle |
| 5,942,246 A | 8/1999 | Mayhew et al. |
| 5,943,213 A | 8/1999 | Sasov |
| 5,949,246 A | 9/1999 | Frankeny et al. |
| 5,950,070 A | 9/1999 | Razon et al. |
| 5,950,304 A | 9/1999 | Khandros et al. |
| 5,959,462 A | 9/1999 | Lum |
| 5,977,640 A | 11/1999 | Bertin et al. |
| 5,984,691 A | 11/1999 | Brodsky et al. |
| 5,994,168 A | 11/1999 | Egawa |
| 6,002,178 A | 12/1999 | Lin |
| 6,013,944 A | 1/2000 | Moriya et al. |
| 6,018,462 A | 1/2000 | Sakuyama |
| 6,020,220 A | 2/2000 | Gilleo et al. |
| 6,024,275 A | 2/2000 | Takiar |
| 6,032,356 A | 3/2000 | Eldridge et al. |
| 6,034,332 A | 3/2000 | Moresco et al. |
| 6,046,600 A | 4/2000 | Whetsel |
| 6,049,467 A | 4/2000 | Tamarkin et al. |
| 6,050,829 A | 4/2000 | Eldridge et al. |
| 6,053,395 A | 4/2000 | Sasaki |
| 6,064,213 A | 5/2000 | Khandros et al. |
| 6,069,026 A | 5/2000 | Terrill et al. |
| 6,080,264 A | 6/2000 | Ball |
| 6,080,494 A | 6/2000 | Abbott |
| 6,082,610 A | 7/2000 | Shangguan et al. |
| 6,083,773 A | 7/2000 | Lake |
| 6,098,278 A | 8/2000 | Vindasius et al. |
| 6,101,100 A | 8/2000 | Londa |
| 6,104,202 A | 8/2000 | Slocum et al. |
| 6,133,070 A | 10/2000 | Yagi et al. |
| 6,136,681 A | 10/2000 | Razon et al. |
| 6,137,299 A | 10/2000 | Cadieux et al. |
| 6,147,400 A | 11/2000 | Faraci et al. |
| 6,154,371 A | 11/2000 | Oba et al. |
| 6,161,205 A | 12/2000 | Tuttle |
| 6,190,940 B1 * | 2/2001 | DeFelice et al. ............ 438/106 |
| 6,218,910 B1 | 4/2001 | Miller |
| 6,229,216 B1 | 5/2001 | Ma et al. |
| 6,242,279 B1 | 6/2001 | Ho et al. |
| 6,242,932 B1 | 6/2001 | Hembree |
| 6,246,247 B1 | 6/2001 | Eldridge et al. |
| 6,258,627 B1 | 7/2001 | Benenati et al. |
| 6,275,051 B1 | 8/2001 | Bachelder et al. |
| 6,281,046 B1 | 8/2001 | Lam |
| 6,297,553 B1 | 10/2001 | Horiuchi et al. |
| 6,303,992 B1 | 10/2001 | Van Pham et al. |
| 6,313,522 B1 | 11/2001 | Akram et al. |
| 6,319,829 B1 | 11/2001 | Pasco et al. |
| 6,331,782 B1 | 12/2001 | White et al. |
| 6,372,547 B2 | 4/2002 | Nakamura et al. |
| 6,372,548 B2 | 4/2002 | Bessho et al. |
| 6,376,769 B1 | 4/2002 | Chung |
| 6,392,428 B1 * | 5/2002 | Kline et al. ................. 324/755 |
| 6,432,744 B1 | 8/2002 | Amador et al. |
| 6,440,771 B1 | 8/2002 | Pierce |
| 6,483,043 B1 | 11/2002 | Kline |
| 6,483,330 B1 | 11/2002 | Kline |
| 6,524,885 B2 | 2/2003 | Pierce |
| 6,529,022 B2 | 3/2003 | Pierce |
| 6,537,831 B1 | 3/2003 | Kline |
| 6,627,998 B1 | 9/2003 | Caletka et al. |
| 6,717,819 B1 | 4/2004 | Chung |
| 6,759,741 B2 | 7/2004 | Kline |
| 6,812,048 B1 | 11/2004 | Kline |
| 6,815,712 B1 | 11/2004 | Kline |
| 6,822,469 B1 | 11/2004 | Kline |
| 6,825,678 B2 | 11/2004 | Kline |
| 2002/0011663 A1 | 1/2002 | Khandros et al. |

* cited by examiner

WAFER INTERPOSER ASSEMBLY

CROSS-REFERENCE TO RELATED APPLICATION

This is a divisional application of application Ser. No. 09/738,228, entitled Method for Building an Interposer onto a Semiconductor Wafer Using Laser Techniques, filed on Dec. 15, 2000 now U.S. Pat. No. 6,524,885 in the name of John L. Pierce.

TECHNICAL FIELD OF THE INVENTION

The present invention relates generally to the field of integrated circuits, and more particularly, to a wafer interposer assembly and a system for building the same.

BACKGROUND OF THE INVENTION

Without limiting the scope of the invention, this background of the present invention will be described with reference to building a semiconductor wafer-interposer, as an example. After the introduction of the integrated circuit, engineers have worked diligently to produce electronic devices that are smaller and more functional than the previous versions of the devices. Advances in manufacturing techniques allow more components to be integrated into a smaller semiconductor die. More components within the die enable engineers to design devices having greater efficiency and more convenient functions. However, increasing the number of components within the die can adversely affect the size and manufacturing costs of the device.

Each new device design often requires smaller, more efficient semiconductor packages to perform advanced functions and consume less power and space. Die size and number of contact pads influence the size of a semiconductor package. More components within the die require more contact pads, which facilitate electrical connections or interfaces between the die to other systems in the device. However, traditional connection techniques are not very space efficient.

Traditionally, die design was limited because all connections between the components of the die interfacing systems were through the peripheral edges of the chip (for wire bonding) or through a standard pin or pad layout defined by a standardization body, such as the Joint Electrical Dimensional Electronic Committee (JEDEC). The interconnection requirements, therefore, have traditionally driven the die layout.

Although space efficiency may be improved by using a semiconductor wafer-interposer, it is difficult to attached a separate interposer to a semiconductor wafer and maintain close dimensional tolerances. Close tolerance for package height is a requirement for many applications. Typically, thick packages are more reliable and have lower manufacturing costs. In contrast, thin packages may be required for applications where space and weight are at a premium. Additionally, manufacturing a thin package is usually costly because smaller components are more difficult to process and require more precise machinery.

Current manufacturing processes cannot precisely and efficiently control the final height of the package. After the wafer-interposer assembly is diced, the footprint of the resulting semiconductor package is almost the size of the die, which is as small as the package can be without making a smaller die. However, the height of the package cannot be as accurately controlled because it varies according to the method used to construct the wafer-interposer.

Another costly manufacturing process associated with assembling semiconductor packages having interposers is aligning the die with the interposer. The contact pads on the die and the interposer must be aligned and connected to result in a functional semiconductor package. Aligning minute contacts between the die and interposer is an expensive and time intensive process. Current available methods of alignment slow the manufacturing process and increase costs.

Accordingly, there is a need for a system, method and apparatus for building a semiconductor wafer-interposer assembly that overcomes the present manufacturing limitations and inefficiencies.

SUMMARY OF THE INVENTION

The present invention overcomes the existing manufacturing limitations and inefficiencies in the art by providing a wafer interposer assembly and system for building the same. The wafer interposer assembly includes a semiconductor wafer having a die and a redistribution layer pad, electrically connected to the die. An epoxy layer is deposited on the surface of the redistribution layer pad and the die. An opening is positioned through the epoxy layer and an interposer pad is positioned in the opening in electrical contact with the redistribution layer pad.

In one embodiment, the semiconductor wafer of the wafer interposer assembly includes a plurality of die. The redistribution layer pad may comprise a material reflective to laser frequencies, a material compatible with solder, or a material compatible with conductive polymer. The epoxy layer may be disposed on the surface by a deposition process selected from the group consisting of spraying, rolling and vapor deposition. Moreover, the epoxy layer may comprise a nonconductive material having a coefficient of thermal expansion similar to the wafer. The height of the cured epoxy layer may be at least the length of the redistribution layer pad. The curing may involve a processes selected from the group consisting of heat processes and chemical processes. The epoxy layer is trimmed by a laser process to achieve a flat surface and controlled height. Additionally, the interposer pad may comprise a conductive material that is positioned in the opening which may be formed by a laser process. An epoxy coat is disposed on a backside of the wafer.

In another aspect, the present invention is directed to a system for building a wafer interposer assembly. A depositor deposits an epoxy layer onto the surface of a semiconductor wafer having a plurality of die and a plurality of redistribution layer pads electrically connected to each die. A laser operates relative to the semiconductor wafer to trim the epoxy layer to a flat surface and controlled height and to bore a plurality of openings in alignment with the redistribution layer pads through the epoxy layer. A screener screens an interposer pad into the openings and into electrical contact with the redistribution layer pads.

In one embodiment, the depositor is selected from the group consisting of spraying depositors, rolling depositors and vapor depositors. The laser may operate under the control of a controller that comprises a computer-numerical-control machine that maneuvers and operates the laser in three dimensions. A curing means employing a heat process or chemical process may be employed for curing the epoxy layer. The screener may screen a conductive material into the openings to form the interposer pads. An alignment mark may be position on the semiconductor wafer to provide orientation to the laser. Additionally, the depositor may deposit an epoxy coat on the backside of the semiconductor wafer and the laser may adjust the height of the epoxy coat.

BRIEF DESCRIPTION OF THE DRAWINGS

The above and further advantages of the invention may be better understood by referring to the following description in conjunction with the accompanying drawings in which corresponding numerals in the different figures refer to corresponding parts and in which.

DETAILED DESCRIPTION OF THE INVENTION

Although making and using various embodiments of the present invention are discussed herein in terms of using laser techniques to build an interposer onto a wafer, it should be appreciated that the present invention provides many applicable inventive concepts that can be embodied in a wide variety of specific contexts. The specific embodiments discussed herein are merely illustrative of specific ways to make and use the invention and do not limit the scope of the invention.

Interposers allow greater freedom to die designers because the layout of a die and its contact pads can be defined according to the interaction of the functional elements of the die rather than according to the standardization requirements. The interposer can be designed with a standardized layout of contact pads on its upper surface and can electrically connect each die pad to a corresponding interposer contact pad without an interposer pad being directly above its corresponding die pad. Not only does the interposer provide for standardized interconnection, it also provides for the use of standard test hardware, software, cabling and connectors compatible with existing industry infrastructure.

An additional advantage of the interposer is that more than one interposer can be designed for each wafer. A manufacturer can then, by substituting a different interposer, modify the layout of the interposer pads to conform to a different layout or packaging standard. Alternatively, if the die and interposer are designed for modularity, a single interposer design may be useful on more than one chip design. A specific interposer design will typically be necessary for each unique die design.

Figure 1A:
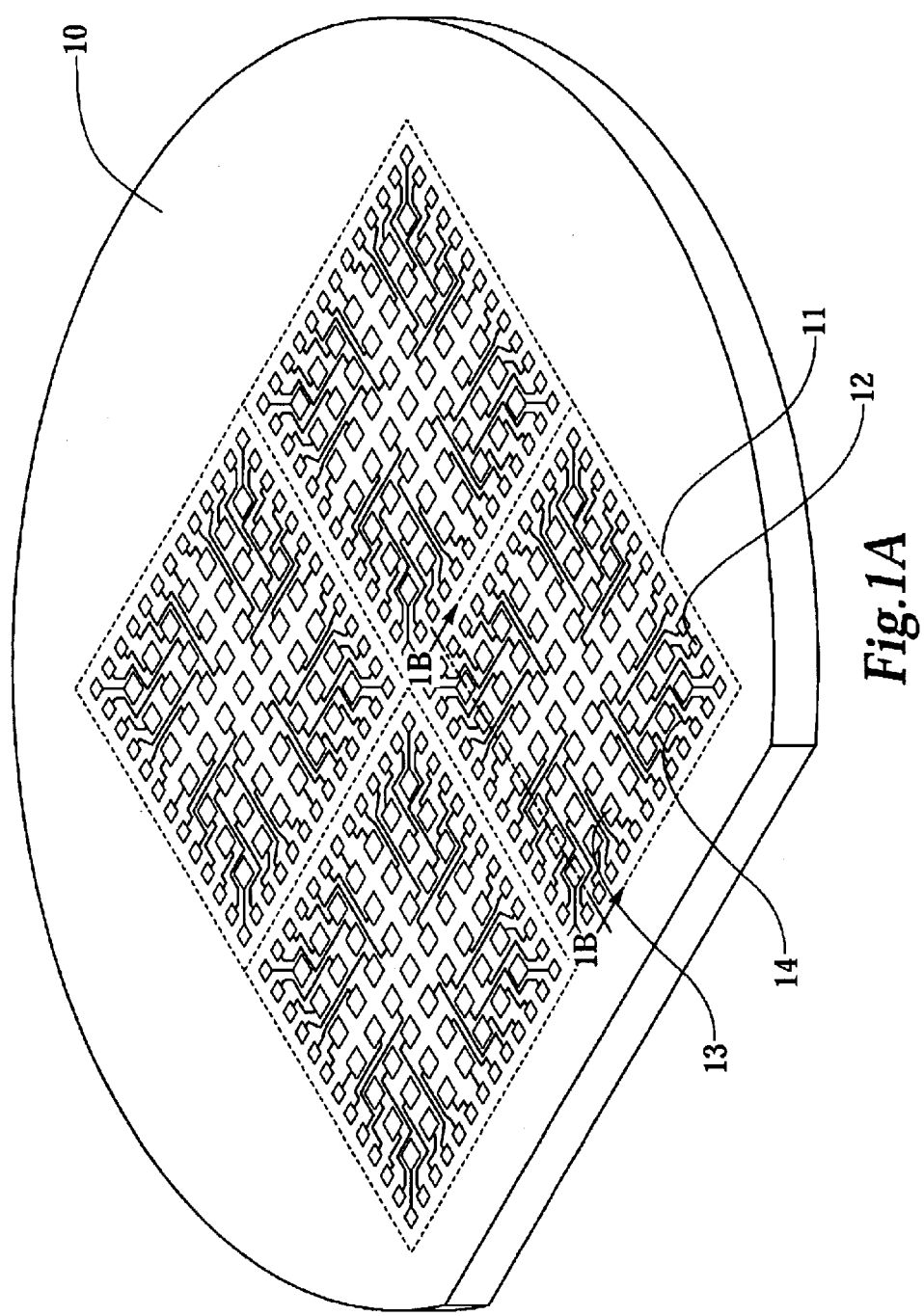
FIG. 1A is a perspective view of a semiconductor wafer in accordance with certain embodiments of the present invention.
Figure 1B:
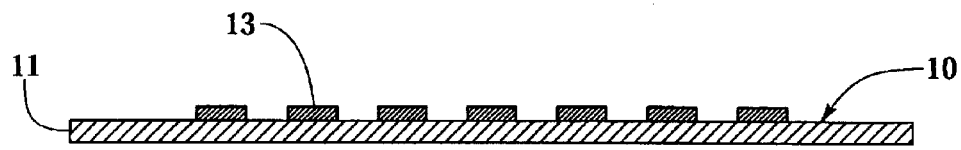
FIG. 1B is a cross-sectional view of the semiconductor wafer of FIG. 1A taken along line 1B—1B.

FIG. 1A depicts a semiconductor wafer 10 having a plurality of die including a die 11, which may have many circuits within its structure. Referring now to FIG. 1A and FIG. 1B, which is a cross-sectional view of FIG. 1A along line 1B—1B, the wafer 10 may have several identical or different dice 11, which eventually may be separated or diced into individual semiconductor chips. For clarity of illustration, dashed lines are used to represent the kerfs between die 11. One or more die pads 12 electrically contact the circuits within die 11. An underbump metalization may be deposited onto the die pads 12. A redistribution layer (RDL) may then be deposited onto the wafer 10. One or more known semiconductor processes, such as photolithography or etching for example, may be used to process the RDL into RDL pads 13. The RDL pads 13 may then be connected to the die pads 12 by connectors 14. The RDL pads 13 provide an interface between the circuits of the die 11 and an interposer. Each of the die pads 12 corresponds to a particular RDL pad 13.

The RDL pads 13 may be a material that is reflective to laser frequencies to facilitate subsequent processes of the present invention. The RDL pads 13 may also be made from a material that is compatible with solder or conductive polymer. Copper, for example, may be one suitable material for RDL pads 13. Other materials that are electrically conductive and compatible with solder or conductive polymers may also be used for the RDL pads 13 and will be apparent to those having ordinary skill in the art.

The layout and size of the RDL pads 13 may have the same configuration as the pad configuration of a finished semiconductor package. Designing the configuration of the RDL pads 13 to match the requirements of the finished package increases manufacturing efficiency. Multiple, identical dice 11 may be efficiently produced in large quantities and used in a variety of different applications by simply changing the configuration of the RDL pads 13. Efficiency increases because the same die 11 may be used for multiple applications that require different semiconductor package configurations.

Figure 2:
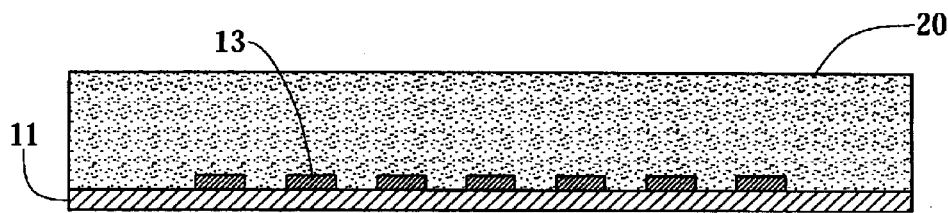
FIG. 2 is a cross-sectional view of a wafer-interposer assembly in accordance with certain embodiments of the present invention.

Next, the wafer 10 is coated with a layer of epoxy 20 as depicted in FIG. 2. The epoxy 20 may be applied using any of many semiconductor chip manufacturing techniques known in the art. Spraying, rolling or vapor deposition, for example, is used to apply the epoxy 20 to the wafer 10. The epoxy 20 may be non-conductive and may have a coefficient of thermal expansion similar to the wafer 10. The epoxy 20 may also be able to withstand the heat required to re-flow solder or other conductive material that is applied to the wafer 10 in subsequent processes. An epoxy material suitable for underfill, for example, may be used.

Figure 3A:
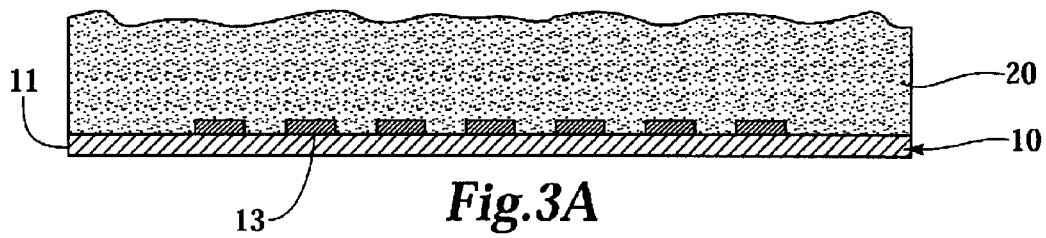
FIG. 3A is a cross-sectional view of a wafer-interposer assembly in accordance with certain embodiments of the present invention.

The epoxy 20 should be applied or deposited to a height that exceeds the upper surface of the RDL pads 13 by at least the diameter of the RDL pads 13. The epoxy 20 is then cured as required by the particular properties of the epoxy 20. Some curing methods may include infrared heat or chemical processes, for example. The cured epoxy 20 may have a relatively rough or undulating surface, as best seen in FIG. 3A. However, a desirable minimum thickness is one that extends past the upper surface of the RDL pads 13 by approximately the diameter of the RDL pads 13.

Figure 3B:
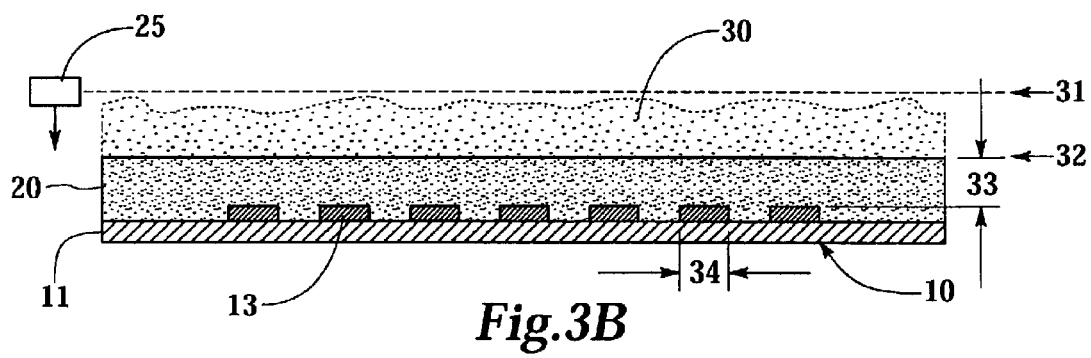
FIG. 3B is a cross-sectional view of a wafer-interposer assembly in accordance with certain embodiments of the present invention.

FIG. 3B depict a trimming process that may vaporize the top of the epoxy 20 to achieve a very flat surface and controlled height. An exaggerated surface of the epoxy 20 is shown in FIG. 3A. The thinnest point of the epoxy 20 should be approximately at least as thick as the diameter 34 of the RDL pad 13 plus the height of the RDL pad 13.

A controller (not shown) may be used to operate a laser 25 to vaporize selected areas of the epoxy 20. The controller, for example, may be the type of controller utilized for computer-numerical-control (CNC) machining, which maneuvers and operates a tool in three dimensions. In this particular application, the controller maneuvers the laser 25 about the wafer 10 and selectively vaporizes portions of the epoxy 20. The process of removing the epoxy 20 will be described in further detail below.

In FIG. 3B, the laser 25 may be aimed at initial elevation 31 and generally parallel to the surface of the wafer 10. This initial elevation 31 of the laser 25 may be slightly above the highest point of the epoxy 30. The controller begins sweeping the laser 25 across the wafer 10 and slowly lowers the laser 25 through excess epoxy 30 to final elevation 32. As it is lowered, the laser 25 impinges on high points of the surface of the epoxy 20 and vaporizes the excess epoxy 30 as the laser 25 sweeps across the entire wafer 10. The elevation 32 is at a point where the distance 33 between the surface of the epoxy 20 and the surface of the RDL pads 13 is approximately the diameter 34 of the RDL pads 13. The distance 33 may be varied to optimize the aspect ratio for conductor screening, which will be described below.

Figure 4:
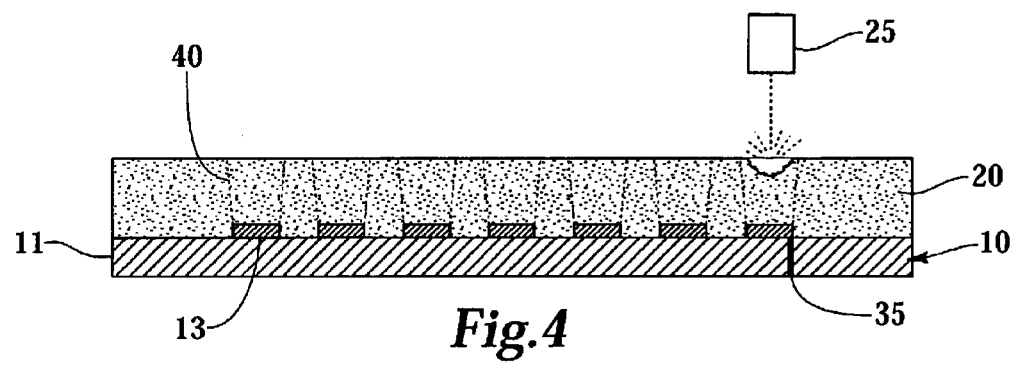
FIG. 4 is a cross-sectional view of a wafer-interposer assembly in accordance with certain embodiments of the present invention.

Once the epoxy 20 is planarized, the laser 25 may also be used to create openings 40, the locations of which are represent by dashed lines, in the epoxy 20 as depicted in FIG. 4. The laser 25 is first oriented to the wafer 10 using alignment marks 35 on the wafer 10. If the alignment marks 35 have been covered during the epoxy coating process, a rough alignment can be made using a flat spot or other reference point on the wafer 10. Next, the laser 25 may be used to etch away the epoxy 20 around the alignment marks 35. After the alignment marks 35 are located, the location of RDL pads 13 can be very accurately determined by using the alignment marks 35 in conjunction with a coordinate map of the RDL pads 13. The laser 25 creates the openings 40 by vaporizing the epoxy 30. The laser 25 vaporizes the epoxy 20 down to the surface of the RDL pads 13 but does not affect the RDL pads 13 because of the reflective properties of the RDL pads 13.

This process is similar to using the laser 25 as a drill. The controller determines drilling locations, which are generally above the RDL pads 13, by moving the laser 25 relative to the alignment marks 35. The laser 25 may then be activated to vaporize the epoxy 20 and "drill" the openings 40. The RDL pads 13 act as "drill stops" because the RDL pads 13 reflect the laser 25 instead of being vaporized by the laser 25.

Figure 5:
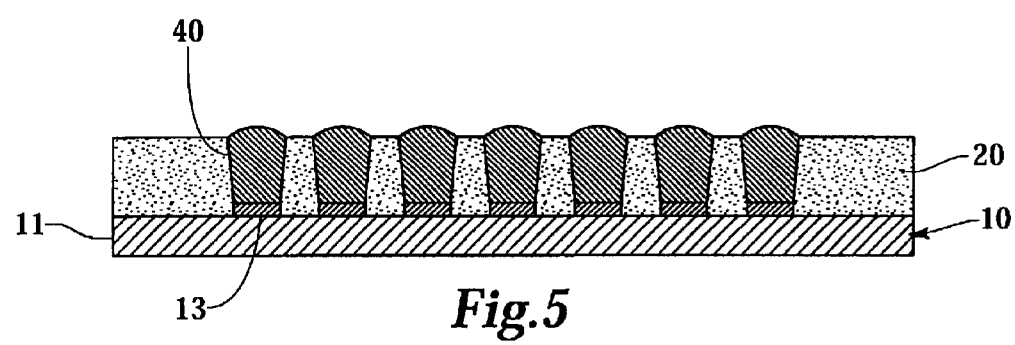
FIG. 5 is a cross-sectional view of a wafer-interposer assembly in accordance with certain embodiments of the present invention.

FIG. 5 shows the openings 40 filled with a conductive material by screening, for example, to form interposer pads 50. The aspect ratio of the openings 40 may be adjusted so that the conductive material easily flows into the openings 40 and adequately fills the openings without leaving any voids. Also, the aspect ratio facilitates the conductive material filling the openings 40 and contacting the RDL pads 13. The conductive material may be solder, conductive polymer or any other suitable material and may be screened into the openings 40. The conductive material forms a permanent and reliable electrical connection to RDL pads 13. After screening into the openings 40, the conductive material is re-flowed or cured. After re-flowing or curing, the wafer-interposer is at minimum thickness. If a thicker package is required or if it is desirable to protect the backside of the die 11, then an epoxy coat can be applied to the back of the wafer 10, as best seen in FIG. 6.

The interposer pads 50 may be used as contacts for testing and burn-in of the wafer 10. The interposer pads 50 may also be used to connect and attach the resulting device to a printed circuit board or other structure after the interposer is diced into individual circuits.

Figure 6:
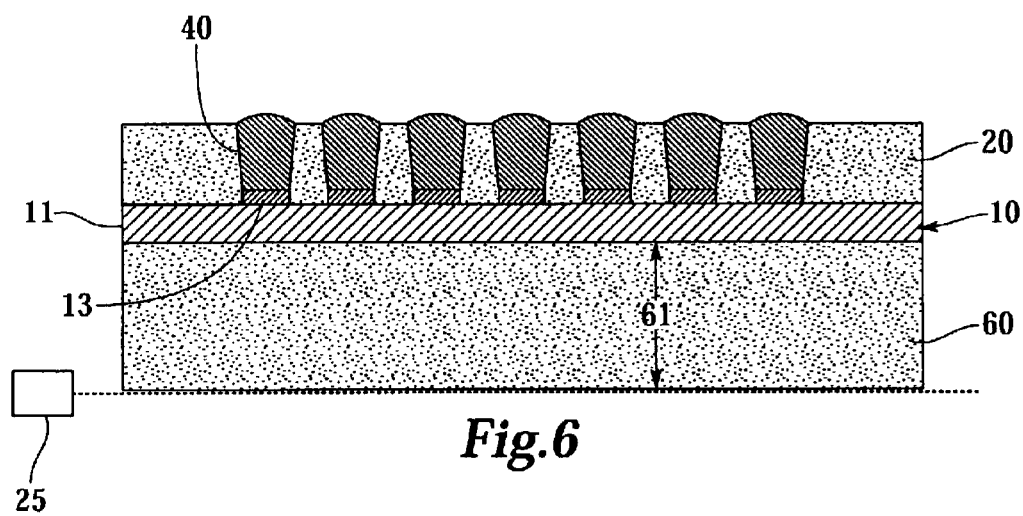
FIG. 6 is a cross-sectional view of a wafer-interposer assembly in accordance with certain embodiments of the present invention.

FIG. 6 depicts the wafer-interposer having an additional layer of epoxy 60, which may be added to the backside of the wafer 10. The technique for applying the epoxy 60, the composition of the epoxy 60 and the method for creating a dimensionally precise surface is similar to the process for the front side of the wafer 10, which has been described above. The thickness 61 of the wafer-interposer may be adjusted by removing and leveling the epoxy 60 using the laser 25. Because there are no electrical contacts on the backside of the wafer 10, the thickness 61 may be adjusted without concern for maintaining a particular aspect ratio. After construction of the wafer-interposer is complete, testing and burn-in may be performed while all circuits are in wafer form. After final testing, the wafer-interposer may be diced into individual components.

While specific alternatives to steps of the invention have been described herein, additional alternatives not specifically disclosed but known in the art are intended to fall within the scope of the invention. Thus, it is understood that other applications of the present invention will be apparent to those skilled in the art upon the reading of the described embodiment and a consideration of the appended claims and drawings.

What is claimed is:

1. A wafer interposer assembly comprising:
   a semiconductor wafer having a die;
   a redistribution layer (RDL) pad electrically connected to the die;
   an epoxy layer deposited on the surface of the redistribution layer pad and, the die, the epoxy layer having an opening therethrough about the redistribution layer pad, and
   an interposer pad positioned in the opening in electrical contact with the redistribution layer pad.

2. The wafer interposer assembly as recited in claim 1, wherein the semiconductor wafer includes a plurality of die.

3. The wafer interposer assembly as recited in claim 1, wherein the redistribution layer pad comprises a material reflective to laser frequencies.

4. The wafer interposer assembly as recited in claim 1, wherein the redistribution layer pad comprises a material compatible with solder.

5. The wafer interposer assembly as recited in claim 1, wherein the redistribution layer pad comprises a material compatible with conductive polymer.

6. The wafer interposer assembly as recited in claim 1, wherein the epoxy layer is disposed on the surface by a deposition process selected from the group consisting of spraying, rolling and vapor deposition.

7. The wafer interposer assembly as recited in claim 1, wherein the epoxy layer comprises a nonconductive material having a coefficient of thermal expansion similar to the wafer.

8. The wafer interposer assembly as recited in claim 1, wherein the height of the epoxy layer is at least the length of the redistribution layer pad.

9. The wafer interposer assembly as recited in claim 1, wherein the epoxy layer is cured.

10. The wafer interposer assembly as recited in claim 1, wherein the epoxy layer is cured by a processes selected from the group consisting of heat processes and chemical processes.

11. The wafer interposer assembly as recited in claim 1, wherein the epoxy layer is trimmed to achieve a flat surface and controlled height.

12. The wafer interposer assembly as recited in claim 1, wherein the epoxy layer is trimmed by a laser process to achieve a flat surface and controlled height.

13. The wafer interposer assembly as recited in claim 1, wherein the interposer pad comprises a conductive material.

14. The wafer interposer assembly as recited in claim 1, wherein the opening is formed by a laser process.

15. The wafer interposer assembly as recited in claim 1, further comprising an epoxy coat disposed on a backside of the wafer.

16. A wafer interposer assembly comprising:

a semiconductor wafer having a plurality of die;

a plurality of redistribution layer pads electrically connected to each die, the redistribution layer pads including a material reflective to laser frequencies;

an epoxy layer deposited on the surface of the redistribution layer pads and the dies, the epoxy layer having a plurality of openings therethrough corresponding to the redistribution layer pads, the epoxy layer having a flat surface that is trimmed to a height of at least the length of the redistribution layer pads; and a plurality of interposer pads positioned in the openings in electrical contact with the redistribution layer pads.

17. The wafer interposer assembly as recited in claim 16, wherein the epoxy layer is trimmed by a laser process to achieve a flat surface and controlled height.

18. The wafer interposer assembly as recited in claim 16, wherein the openings are formed by a laser process.

19. A wafer interposer assembly comprising:

a semiconductor wafer having a die disposed therein having a surface having a peripheral region and an inboard region;

a plurality of die pads disposed on the peripheral region of the die;

a plurality of redistribution layer pads disposed on the inboard region of the die, at least one redistribution layer pad being electrically connected to at least one die pad via a connector;

an epoxy layer deposited on the surface of the redistribution layer pad and the die, the epoxy layer having an opening therethrough about the redistribution layer pad; and an interposer pad positioned in the opening in electrical contact with the redistribution layer pad.

20. The water interposer assembly am recited in claim 19, wherein the semiconductor wafer includes a plurality of die.

21. The wafer interposer assembly as recited in claim 19, wherein the redistribution layer pads comprise a material reflective to laser frequencies.

22. The wafer interposer assembly as recited in claim 19, wherein the redistribution layer pads comprise a material compatible with solder.

23. The wafer interposer assembly as recited in claim 19, wherein the redistribution layer pads comprise a material compatible with conductive polymer.

24. The wafer interposer assembly as recited in claim 19, wherein the epoxy layer is disposed on the surface by a deposition process selected from the group consisting of spraying, rolling and vapor deposition.

25. The wafer interposer assembly as recited in claim 19, wherein the epoxy layer comprises nonconductive material having a coefficient of thermal expansion similar to the wafer.

26. The wafer interposer assembly as recited in claim 19, wherein the height of the epoxy layer is at least the length of a redistribution layer pad.

27. The wafer interposer assembly as recited in claim 19, wherein the epoxy layer is cured.

28. The wafer interposer assembly as recited in claim 19, wherein the epoxy layer is cured by a processes selected from the group consisting of heat processes and chemical processes.

29. The wafer interposer assembly as recited in claim 19, wherein the epoxy layer is trimmed to achieve a flat surface and controlled height.

* * * * *